US012685031B2

(12) United States Patent
Van Der Wiel

(10) Patent No.: US 12,685,031 B2
(45) Date of Patent: Jul. 14, 2026

(54) MAGNETIC SENSOR DEVICE, AND METHOD OF PRODUCING SAME

(71) Applicant: Melexis Technologies SA, Bevaix (CH)

(72) Inventor: Appo Van Der Wiel, Tessenderlo (BE)

(73) Assignee: MELEXIS TECHNOLOGIES SA, Bevaix (CH)

( * ) Notice: Subject to any disclaimer, the term of this patent is extended or adjusted under 35 U.S.C. 154(b) by 349 days.

(21) Appl. No.: 18/453,419

(22) Filed: Aug. 22, 2023

(65) Prior Publication Data

US 2024/0065112 A1 Feb. 22, 2024

(30) Foreign Application Priority Data

Aug. 22, 2022 (EP) ..................................... 22191540

(51) Int. Cl.
*H10N 59/00* (2026.01)
*G01L 3/10* (2006.01)
(Continued)

(52) U.S. Cl.
CPC ............. *H10N 59/00* (2023.02); *G01L 3/101* (2013.01); *G01L 3/102* (2013.01); *G01R 15/20* (2013.01);
(Continued)

(58) Field of Classification Search
CPC ........ H10N 59/00; H10N 39/00; G01L 3/101; G01L 3/102; G01R 15/20; G01R 33/0047; G01R 33/0052; G01R 33/09; H01L 21/56; H01L 23/5386; H01L 25/16; H01L 2924/10253
See application file for complete search history.

(56) References Cited

U.S. PATENT DOCUMENTS

2013/0221452 A1 8/2013 Strothmann et al.
2014/0130612 A1* 5/2014 Takahashi ............... G01L 3/104
324/207.13
(Continued)

FOREIGN PATENT DOCUMENTS

DE 19929864 A1 1/2001
DE 102016122172 A1 1/2018
(Continued)

OTHER PUBLICATIONS

Extended European Search Report from European Patent Application No. EP22191552.3, Jan. 30, 2023.
(Continued)

*Primary Examiner* — Ryan D Walsh
(74) *Attorney, Agent, or Firm* — WORKMAN NYDEGGER

(57) ABSTRACT

A wafer-level packaged magnetic sensor device includes: a first semiconductor substrate having a processing circuit configured for receiving a plurality of sensor signals, and for determining at least one difference signal, and for providing an output signal derived from said difference signal. A plurality of sensor substrates include a second semiconductor substrate with a first magnetic sensor, and a third semiconductor substrate with a second magnetic sensor the first semiconductor substrate being arranged at a location between the plurality of sensor substrates. The substrates are electrically connected by means of at least one redistribution layer.

18 Claims, 9 Drawing Sheets

(51) Int. Cl.

| | | |
|---|---|---|
| *G01R 15/20* | (2006.01) | |
| *G01R 33/00* | (2006.01) | |
| *G01R 33/09* | (2006.01) | |
| *H10N 39/00* | (2026.01) | |
| *H10W 70/60* | (2026.01) | |
| *H10W 70/65* | (2026.01) | |
| *H10W 74/01* | (2026.01) | |
| *H10W 90/00* | (2026.01) | |

(52) U.S. Cl.

CPC ..... *G01R 33/0047* (2013.01); *G01R 33/0052* (2013.01); *G01R 33/09* (2013.01); *H10N 39/00* (2023.02); *H10W 70/611* (2026.01); *H10W 70/65* (2026.01); *H10W 74/01* (2026.01); *H10W 90/00* (2026.01)

(56) References Cited

U.S. PATENT DOCUMENTS

| | | | |
|---|---|---|---|
| 2015/0076636 | A1 | 3/2015 | Beer et al. |
| 2016/0223594 | A1* | 8/2016 | Suzuki ................... G01R 15/20 |
| 2019/0187008 | A1 | 6/2019 | Schanz et al. |
| 2024/0060838 | A1* | 2/2024 | Van Der Wiel ......... G01L 3/102 |
| 2024/0410919 | A1* | 12/2024 | Qu ....................... G01R 15/207 |
| 2025/0067608 | A1* | 2/2025 | Van Der Wiel ......... G01L 3/102 |

FOREIGN PATENT DOCUMENTS

| | | | |
|---|---|---|---|
| EP | 1037029 | A2 | 9/2000 |
| EP | 1566649 | A1 | 8/2005 |
| EP | 2682772 | A1 | 1/2014 |
| EP | 3885779 | A1 | 9/2021 |
| EP | 3974846 | A1 | 3/2022 |
| WO | 2021048601 | A1 | 3/2021 |
| WO | 2022090117 | A1 | 5/2022 |

OTHER PUBLICATIONS

Extended European Search Report from European Patent Application No. EP22191540.8, Feb. 8, 2023.

International Search Report from Corresponding PCT Application No. PCT/EP2023/072993, Nov. 24, 2023.

* cited by examiner

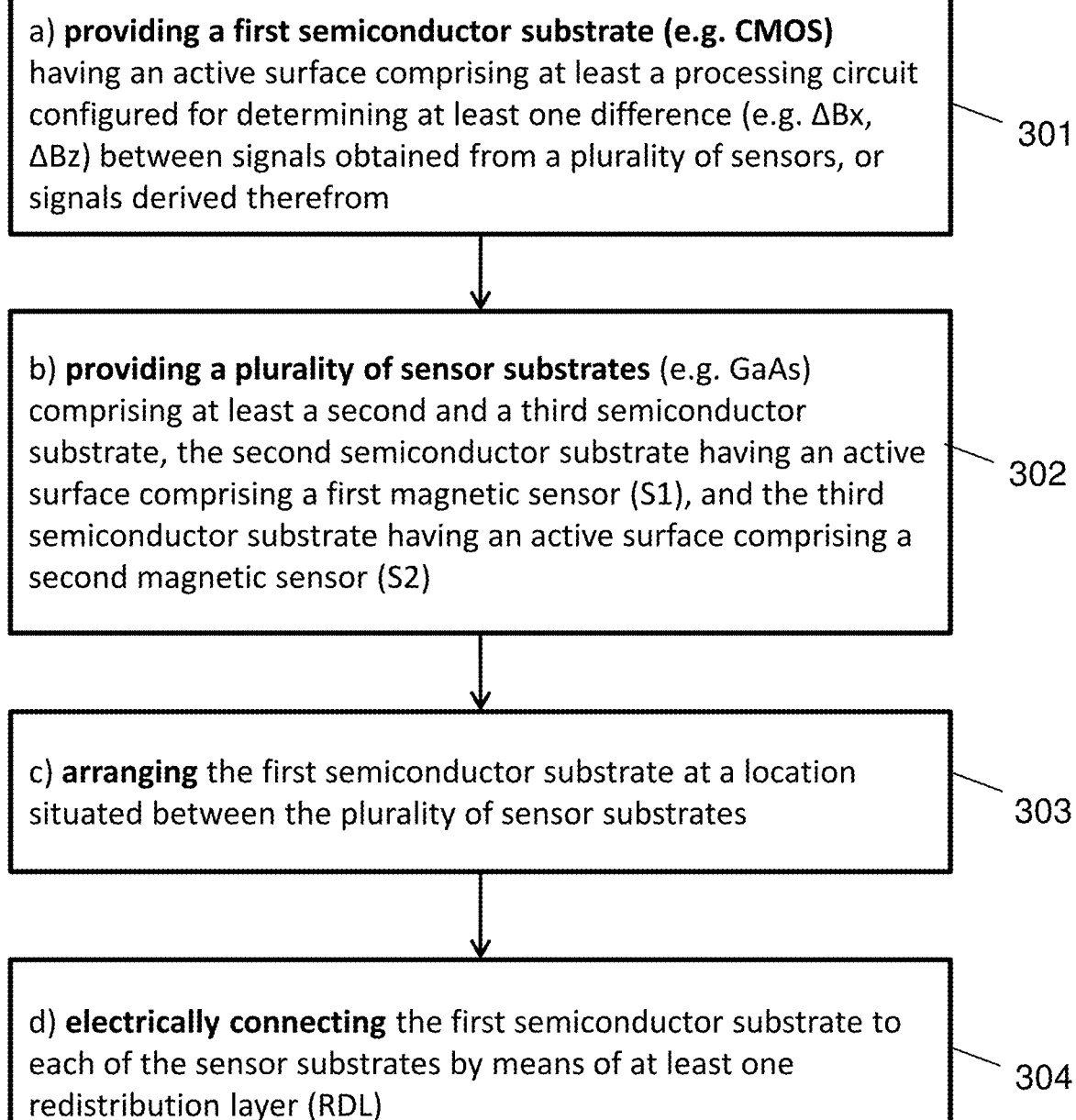

a) providing a first semiconductor substrate (e.g. CMOS) having an active surface comprising at least a processing circuit configured for determining at least one difference (e.g. ΔBx, ΔBz) between signals obtained from a plurality of sensors, or signals derived therefrom

301 b) providing a plurality of sensor substrates (e.g. GaAs) comprising at least a second and a third semiconductor substrate, the second semiconductor substrate having an active surface comprising a first magnetic sensor (S1), and the third semiconductor substrate having an active surface comprising a second magnetic sensor (S2)

302 c) arranging the first semiconductor substrate at a location situated between the plurality of sensor substrates

303 d) electrically connecting the first semiconductor substrate to each of the sensor substrates by means of at least one redistribution layer (RDL)

FIG. 4(a)
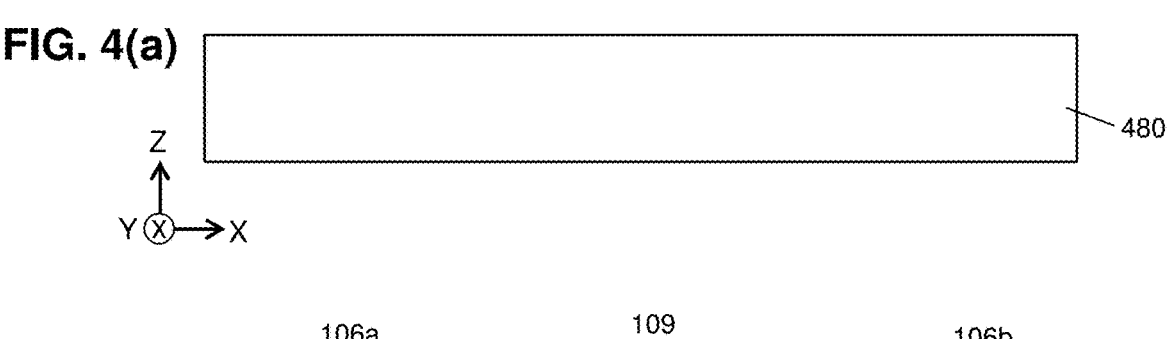
Z
Y ⊗ → X
106a     109     106b
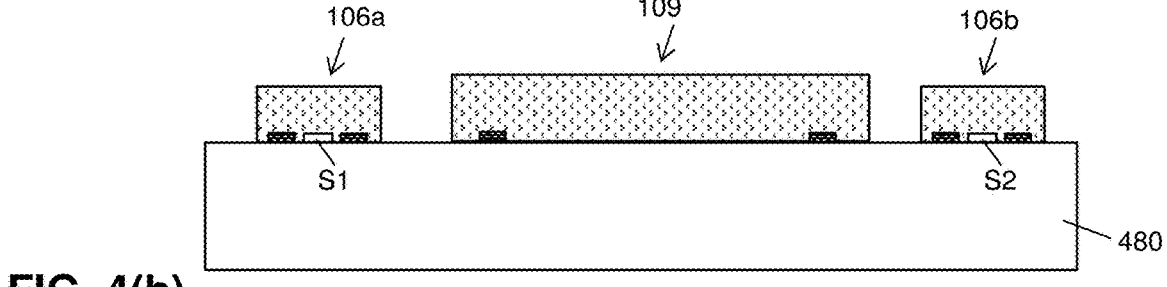
S1     S2
480
FIG. 4(b)
101
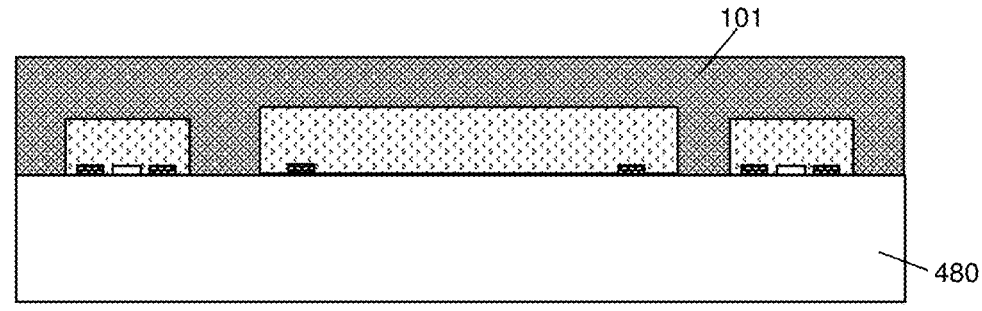
480
FIG. 4(c)
101
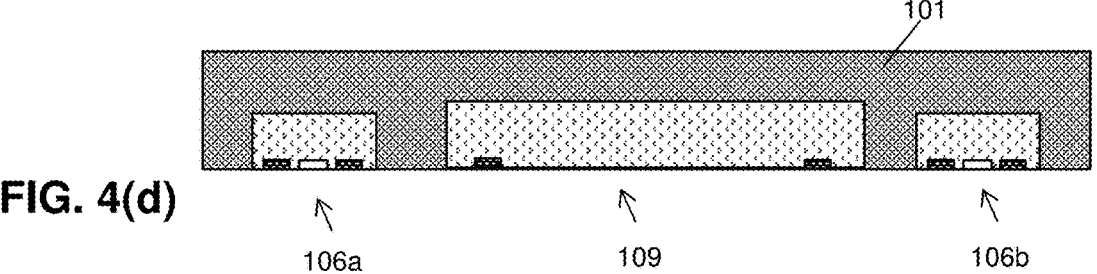
FIG. 4(d)     106a     109     106b

500 →

600 →

700 →

$$I = K*(B1z - Bz2)$$

e.g. $(dx/Wc) = 80\%$ to $120\%$ e.g. T=K*(Bz1-Bz2) and dx ≈ (L1+L3)

MAGNETIC SENSOR DEVICE, AND METHOD OF PRODUCING SAME

FIELD OF THE INVENTION

The present invention relates in general to the field of magnetic sensor devices, and methods of producing magnetic sensor devices.

BACKGROUND OF THE INVENTION

Magnetic sensor devices, e.g. current sensors, torque sensors, etc. are known in the art. They are based on measuring a magnetic field characteristic at one or multiple sensor locations. Depending on the application, the measured magnetic field characteristic(s) may be used to deduct another quantity, such as e.g. a current strength, a position of a magnet, a torque exerted upon a shaft, etc.

Many variants of magnetic sensor devices, systems and methods exist, addressing one or more of the following requirements: using a simple or cheap magnetic structure, using a simple or cheap sensor device, being able to measure over a relatively large range, being able to measure with great accuracy, requiring only simple arithmetic, being able to measure at high speed, being highly robust against positioning errors, being highly robust against an external disturbance field, being able to detect an error, being able to detect and correct an error, having a good signal-to-noise ratio (SNR), being mechanically compact, etc. Often two or more of these requirements conflict with each other, hence a trade-off needs to be made.

Often two or more of these requirements conflict with each other, hence a trade-off needs to be made.

There is always room for improvements or alternatives.

SUMMARY OF THE INVENTION

It is an object of embodiments of the present invention to provide a magnetic sensor device, and a method of producing that magnetic sensor device, and a sensor system using such a magnetic sensor device.

It is also an object of embodiments of the present invention to provide such a device and system with an improved accuracy (e.g. having a better signal-to-noise ratio and being less sensitive to an external disturbance field).

It is also an object of embodiments of the present invention to provide such a device capable of measuring a relatively weak magnetic field (e.g. having a magnetic field strength smaller than 10 mT, or smaller than 3 mT, or smaller than 1 mT).

It is also an object of embodiments of the present invention to provide a magnetic sensor device capable of measuring magnetic field components at two or more sensor locations relatively far apart (e.g. from 3.0 to 25 mm), without requiring a printed circuit board.

It is also an object of embodiments of the present invention to provide a magnetic sensor device with at least two sensor locations, the distance and/or the sensitivity of which can be customized for a particular application without a completely redesign.

The magnetic sensor device provided by the present invention can be used in E-bikes, in automotive applications, industrial applications and robotic applications.

These and other objectives are accomplished by embodiments of the present invention.

According to a first aspect, the present invention provides a magnetic sensor device comprising: a first semiconductor substrate (also referred to herein as "main substrate") having an active surface comprising a processing circuit for processing sensor signals; a plurality of sensor substrates configured for providing a plurality of sensor signals, comprising at least: a second semiconductor substrate (also referred to herein as "first sensor substrate") having an active surface comprising a first magnetic sensor configured for providing at least a first sensor signal, and a third semiconductor substrate (also referred to herein as "second sensor substrate") having an active surface comprising a second magnetic sensor configured for providing at least a second sensor signal; wherein the sensor device is a wafer-level packaged device; the first substrate is situated at a location between the plurality of sensor substrates; the first semiconductor substrate is electrically connected to each of the sensor substrates by means of at least one redistribution layer; the first semiconductor substrate is electrically connected to a plurality of terminals (also referred to herein as "external contacts") by means of said at least one redistribution layer; the processing circuit is configured for receiving said plurality of sensor signals or signals derived therefrom, and for determining at least one difference between said signals, and for providing an output signal (e.g. a current value or a torque value) derived from said at least one difference.

Importantly, this sensor device is formed by wafer level packaging. In such a process, "known good dies" are assembled together to form a single device.

With "sensor signals, or signals derived therefrom" is meant, for example, an amplified and/or digitized version thereof.

It is an advantage of this magnetic sensor device that it can be customized for a particular application, (e.g. in terms of which and how many magnetic field components are measured, and in terms of the distances between these sensor locations) by changing the package layout, and/or by programming another function or K-value in the non-volatile memory, but without having to change the semiconductor substrates themselves.

In other words, the electrical connections from the sensor substrates to the main substrate, and from the main substrate to the external terminals, are formed in a said RDL layer or layers. It is an advantage that the external terminals are in direct contact with the RDL layer, which allows them to be produced using photolithographic processes. This is not the case when using a lead frame.

The terminal may be situated at least partially inside the redistribution layer.

In an embodiment, the output is proportional to a difference between two magnetic field component values, or as a piece-wise-linear function of said difference.

In an embodiment, the processing circuit is programmable (e.g. by means of a constant, or by means of a selectable function, or by means of a piece-wise-linear approximation function, or the like), the device can be used in various domains, e.g. as current sensor, torque sensor, etc. The processing circuit may comprise a programmable processor with a random-access memory (e.g. RAM) and a non-volatile memory (e.g. FLASH). The flash may contain at least one constant value, e.g. a scaling factor K for multiplying the at least one difference.

In a simple embodiment, the sensor device has two "1D magnetic sensors" configured for measuring magnetic field components (e.g. Bz1, Bz2) oriented in a certain direction, at two sensor positions, spaced apart by said predefined distance dx, and the processing circuit is configured for determining a difference between the two measured values, and for multiplying said difference by a predefined constant stored in a non-volatile memory embedded in the main substrate, and for outputting the result, e.g. as a current value (e.g. expressed in Amperes) or as a torque value (e.g. expressed in Nm).

The first substrate may further comprise a biasing and readout circuit, a differential amplifier, and an ADC (analog to digital convertor). Alternatively, one or more of these circuits may be situated on the sensor substrates.

Each of the sensor substrates may comprise a Hall element and four contact zones. Two of these contact zones can be used for providing a biasing voltage or a biasing current to the Hall element, and two others of these contact zones can be used for readout.

In an embodiment, the package furthermore includes at least one passive SMD component, such as a resistor or a capacitor or a diode, e.g. for supressing noise and/or for stabilizing a voltage supply, and/or for reducing impact of EMI (electromagnetic interference).

This offers an important advantage that the sensitive circuits are better protected, even when the sensor device is not mounted on a printed circuit board. This also allows for a more compact mounting of the package in difficult environments, such as e.g. close to a shaft of an E-bike.

In an embodiment, the active surface of the first substrate further comprises first contact zones (e.g. first bondpads), the active surface of the second substrate further comprises second contact zones (e.g. second bondpads), and the active surface of the third substrate further comprises third contact zones (e.g. third bondpads), and the at least one redistribution layer (RDL) interconnects a first subset of the first contact zones with the second contact zones, and interconnects a second subset of the first contact zones with the third contact zones. A third subset of the contact zones of the first substrate is typically connected to so called "terminals", as described next.

In an embodiment, some or all of these first, second and third contact zones (e.g. bondpads) have a shape encompassing an overall rectangular shape with a length≤45 μm and a width≤45 μm, or a length≤40 μm and a width≤40 μm, or a length≤35 μm and a width≤35 μm, or a length≤30 μm and a width≤30 μm, or a length≤25 μm and a width≤25 μm, or a length≤20 μm and a width≤20 μm, or a length≤18 μm and a width≤18 μm, or a length≤15 μm and a width≤15 μm. The length and the width may be ≥5 μm, or may be ≥9 μm, or may be ≥12 μm, or may be ≥15 μm. Such bondpads are sufficiently large for making RDL contacts, but are not sufficiently large for wire-bonding. Indeed, bondpads for wire bonding typically need to have a shape encompassing an overall rectangular shape with a length≥50 μm and a width≥50 μm, e.g. a length and a width in the range from 50 to 100 μm, e.g. a length and a width equal to about 80 μm.

The plurality of terminals may comprise one terminal (e.g. in the form of a contact pad) for receiving a supply voltage (e.g. VDD), and one terminal for receiving a reference voltage (e.g. GND), and one output terminal for providing an output signal. The terminals are exposed to the outside world. Of course, the present invention is not limited to magnetic sensor devices having only three terminals. Indeed, the number of terminals may also be larger than three, for example at least for, or at least six, or at least eight, or at least ten terminals.

A projection of the external terminals in a direction perpendicular to the active surfaces of the substrates may be situated on the main substrate (so called "fan-in"), or may be located outside the periphery of the main substrate ("fan-out").

Preferably a projection of the (external) terminals is not located on the sensor substrates for reasons of stress due to soldering. Some of the terminals may be situated near the corners of the package. External devices can be connected to these terminals by means of wire bonding or soldering or the like.

In an embodiment, the first substrate is spaced from each of the sensor substrates by at least 1.0 mm, or at least 1.5 mm, or at least 2.0 mm, or at least 2.5 mm In this embodiment, the sensor substrates are deliberately situated at a relatively large distance from the first (or main) substrate, even if their size and technology allows them to be arranged closer together. This is counter-intuitive, because usually packages are made "as small as possible", which is not the case here.

In an embodiment, each of the first and second magnetic sensor comprises at least one magnetic sensitive element.

In an embodiment, each magnetic sensor is configured for measuring one magnetic field component oriented in a particular direction, e.g. perpendicular to the substrate (typically referred to herein as the Z-direction), or parallel to the substrate (typically referred to herein as the X or Y direction). Such magnetic sensor may be referred to as a "1D magnetic pixel".

In an embodiment, each magnetic sensor is configured for measuring two orthogonal magnetic field components, e.g. both oriented parallel to the substrate, or one parallel to the substrate and the other orthogonal to the substrate. Such magnetic sensor may be referred to as a "2D magnetic pixel".

In an embodiment, each magnetic sensor is configured for measuring three orthogonal magnetic field components, e.g. two components oriented parallel to the substrate and one component oriented perpendicular to the substrate. Such magnetic sensor may be referred to as a "3D magnetic pixel".

In an embodiment, the number of redistribution layers is only one or only two.

This offers the advantage of a cheaper and a thinner package, and avoids the need for a complex three-dimensional redistribution layer.

The first semiconductor substrate may be a CMOS substrate.

In an embodiment, the first semiconductor substrate mainly comprises silicon; and the second and third semiconductor substrate mainly comprise silicon.

In an embodiment, the first semiconductor substrate mainly comprises silicon; and the second and third semiconductor substrate are discrete (e.g. individual) silicon substrates.

This solution is much more cost effective than integrating hall sensors in a CMOS chip since the price per unit area of a fan-out reconstituted wafer is much less than that of the wafer processing of the signal conditioning CMOS circuit.

The discrete silicon substrates may comprise Hall plates made with a dedicated fabrication process that is not compatible with standard CMOS processing, but provides better performance (e.g. higher sensitivity) than CMOS hall plates.

In an embodiment, the main substrate as well as the sensor substrates are made in CMOS technology but using a different technology node.

In an embodiment, the main substrate is a CMOS silicon substrate, whereas the sensor substrates are bipolar silicon substrates.

In an embodiment, the main substrate may use a first type of sensor elements (e.g. horizontal Hall elements or vertical Hall elements), whereas the sensor substrates may use another type of sensor elements (e.g. magneto-resistive elements, e.g. AMR or XMR elements, or GMI sensors).

In an embodiment, the first semiconductor substrate mainly comprises silicon; and the second and third semiconductor substrate comprise a compound semiconductor material selected from the III-V-group, for example Ga—As or In—As.

This embodiment offers a combination of the following advantages: (1) magnetic sensors with a high sensitivity (e.g. about an order of magnitude larger than horizontal Hall sensors implemented in standard CMOS), (2) increased distance between the sensor elements, hence increased difference signal, (3) cost-effective package.

In an embodiment, the first substrate further comprises a temperature sensor for measuring a temperature of the first substrate, and the processing circuit is configured for temperature correcting the sensor signals before determining said difference, based on the measured temperature.

The temperature correction may be performed in the analogue domain or in the digital domain.

In an embodiment wherein the sensors comprise a single horizontal Hall plate, the electrical resistance of the Hall plates may be used to estimate the individual hall plate temperatures. The electrical resistance may be determined during a calibration test, and stored in the non-volatile memory, or may be calculated during actual use, e.g. by applying a known biasing voltage and measuring the current flowing through the Hall plate, or by applying a known biasing current and measuring the voltage over the Hall plate. As an example, typically one or more pairs of hall plates are used to perform a differential measurement per pair. Then an average temperature reading can be used for temperature compensation of the differential measurement. This average temperature can be obtained from the temperature sensor on the CMOS substrate when the position of this temperature sensor is near the centre of the virtual circle intersecting the individual hall plates.

In an embodiment, each of the sensor substrates further comprises a temperature sensor for measuring a temperature of said sensor substrate, and the processing circuit is configured for temperature correcting the sensor signals before determining said difference, based on these temperature signals.

In an embodiment, the sensors of the sensor substrates are substantially located on a virtual circle, and the number of sensor substrates is two, and the sensors are located 180° apart.

In an embodiment, the sensors of the sensor substrates are substantially located on a virtual circle, and the number of sensor substrates is three, and the sensors are located 120° apart.

In an embodiment, the sensors of the sensor substrates are substantially located on a virtual circle, and the number of sensor substrates is four, and the sensors are located 90° apart.

In an embodiment, the sensors of the sensor substrates are substantially located on a virtual circle, and the number of sensor substrates is three, and the sensors are located 90° apart.

In an embodiment, the magnetic sensor device comprises only two sensor substrates, and the first substrate is situated between the first and the second sensor substrate, e.g. in the middle between the two sensor substrates, e.g. as illustrated in FIG. 1A, FIG. 1B, FIG. 5.

In an embodiment, the magnetic sensor device comprises only three sensor substrates. These sensor substrates may be situated on a virtual circle or a virtual ellipse, and the substrates may be arranged such that a geometric centre of the first substrate is situated inside said virtual circle or virtual ellipse, e.g. near a centre of said circle or ellipse, e.g. as illustrated in FIG. 6.

In an embodiment, the magnetic sensor device comprises only three sensor substrates. These sensor substrates may be situated on a circle or an equilateral triangle. A geometric centre of the first substrate is preferably situated inside said virtual circle or triangle, e.g. near a centre thereof. The sensors may be angular spaced apart by multiples of 120° with respect to the centre of this virtual circle.

In an embodiment, the magnetic sensor device comprises only three sensor substrates. These sensor substrates may be situated at the corners of a right-angled triangle.

In an embodiment, the magnetic sensor device comprises only four sensor substrates. These sensor substrates may be situated on a circle or a square or a diamond. A geometric centre of the first substrate is preferably situated inside said virtual circle or square or diamond, e.g. near a centre thereof, e.g. as illustrated in FIG. 7.

In an embodiment, the first substrate has a size of at most 2.0 mm×2.0 mm or at most 1.5 mm×1.5 mm, and each of the sensor substrates has a size of at most 0.8 mm×0.8 mm or at most 0.5 mm×0.5 mm or at most 0.4 mm×0.4 mm or at most 0.3 mm×0.3 mm, or at most 0.25 mm×0.25 mm. It is a major advantage that contact zones of the sensor substrates will be connected to contact zones of the main substrate by means of one or more RDL layers, because such contact zones can be smaller than contact zones that are to be connected by means of bond wires or wire bonding. As a consequence, also the size of the sensor substrates can be reduced as compared to a sensor substrate having the same magnetic sensor but contact zones that will be connected using bond wires or wire bonding.

In an embodiment, the first substrate has a size of at most 2.0×2.0 mm, and each of the sensor substrates has a size of at most 0.8×0.8 mm, and the sensor substrates are equidistantly spaced (e.g. 2×180°, or 3×120°, or 3×90°, or 4×90°) on a virtual circle having a diameter in the range from 4.0 to 25.0 mm.

In an embodiment, the first substrate comprises an additional magnetic sensor.

In this embodiment, not only the sensor substrates comprise a magnetic sensor, but also the first substrate comprises a magnetic sensor. This magnetic sensor may be embedded in the first substrate, or mounted thereon, e.g. as a thin semiconductor layer.

In an embodiment, the main substrate may use a first type of sensor elements (e.g. horizontal Hall elements or vertical Hall elements), and the sensor substrates may use another type of sensor elements (e.g. magneto-resistive elements, e.g. AMR or XMR elements, or a GMI sensor).

In an embodiment, the active surface of the first substrate, and the active surfaces of the plurality of sensor substrates are situated in a single plane (i.e. they are coplanar).

It is an advantage that the active surfaces of the three substrates are located in a same (virtual) plane, even if the substrates have different thicknesses. This makes it possible to mount the three substrates at a same distance from an external object, e.g. a shaft, a magnet surface, etc.

This also allows that many or all of the vias of the redistribution RDL layer have substantially the same length (in a direction perpendicular to the substrates).

In an embodiment, the active surface of the first substrate comprises a plurality of first contact zones (e.g. bondpads), the active surface of the second substrate comprises a plurality of second contact zones (e.g. bondpads), and the active surface of the third substrate comprises a plurality of third contact zones (e.g. bondpads); and the at least one redistribution layer (RDL) interconnects a first subset of the first contact zones with the second contact zones, and interconnects a second subset of the first contact zones with the third contact zones; and at least some or all of the first, second and third contact zones have a shape encompassing an overall rectangular shape with a length and a width≤45 μm (i.e. a length≤45 μm and a width≤45 μm).

In an embodiment, some or all of the first contact zones (e.g. bondpads) have a shape encompassing an overall rectangular shape with a length and a width≤45 μm (i.e. a length≤45 μm and a width≤45 μm), or ≤40 μm, or ≤35 μm, or ≤30 μm, or ≤25 μm, or ≤20 μm, or ≤18 μm, or ≤15 μm. The length and the width may be ≥5 μm (i.e. the length≥5 μm and the width≥5 μm), or ≥9 μm, or ≥12 μm, or ≥15 μm.

In an embodiment, some or all of the second and third contact zones (e.g. bondpads) have a shape encompassing an overall rectangular shape with a length and a width≤45 μm (i.e. a length≤45 μm and a width≤45 μm), or ≤40 μm, or ≤35 μm, or ≤30 μm, or ≤25 μm, or ≤20 μm, or ≤18 μm, or ≤15 μm. The length and the width may be ≥5 μm (i.e. the length≥5 μm and the width≥5 μm), or ≥9 μm, or ≥12 μm, or ≥15 μm.

According to a second aspect, the present invention also provides a method of producing a magnetic sensor device according to any of the first aspect, comprising the steps of: a) providing a first semiconductor substrate having an active surface comprising at least a processing circuit configured for receiving a plurality of sensor signals, and for determining at least one difference between these sensor signals or signals derived therefrom, and for providing an output signal derived from said at least one difference; b) providing a plurality of sensor substrates comprising at least a second and a third semiconductor substrate, the second semiconductor substrate having an active surface comprising a first magnetic sensor, and the third semiconductor substrate having an active surface comprising a second magnetic sensor; c) arranging the first semiconductor substrate at a location situated between the plurality of sensor substrates; d) electrically connecting the first semiconductor substrate to each of the sensor substrates by means of at least one redistribution layer.

The value provided by the processing circuit may be a current value (e.g. expressed in Amperes) or a Torque value (e.g. expressed in Nm).

The first substrate provided in step c) may further comprise a non-volatile memory containing at least one parameter (e.g. K) for calculating said current value (e.g. expressed in Amperes), or said torque value (e.g. expressed in Nm).

Step d) may comprise placing the three substrates up-side down (i.e. with their active surface facing a base plate), and may further comprise over-moulding the substrates into a reconstituted wafer.

In an embodiment, step c) comprises providing a base substrate (e.g. a glass substrate or a metal substrate); placing the first, second and third semiconductor substrate with their active surfaces facing the base substrate; (This step may comprise using a temporary bonding material) and over-molding the substrates with an epoxy molding compound, and curing (thereby providing a reconstituted wafer).

In an embodiment, the active surface of the first semiconductor substrate provided in step a) comprises first contact zones (e.g. bondpads); and the active surface of the second substrate provided in step b) comprises second contact zones (e.g. bondpads); and the active surface of the third substrate provided in step b) comprises third contact zones (e.g. bondpads); and at least some or all of these first, second and third contact zones have a shape encompassing an overall rectangular shape with a length and a width≤45 μm (i.e. a length≤45 μm and a width≤45 μm), or ≤40 μm, or ≤35 μm, or ≤30 μm, or ≤25 μm, or ≤20 μm, or ≤18 μm, or ≤15 μm. The length and the width may be ≥5 μm (i.e. the length≥5 μm and the width≥5 μm), or ≥9 μm, or ≥12 μm, or ≥15 μm.

In an embodiment, some or all of the first contact zones (e.g. bondpads) have a shape encompassing an overall rectangular shape with a length and a width≤45 μm (i.e. a length≤45 μm and a width≤45 μm), or ≤40 μm, or ≤35 μm, or ≤30 μm, or ≤25 μm, or ≤20 μm, or ≤18 μm, or ≤15 μm. The length and the width may be ≥5 μm (i.e. the length≥5 μm and the width≥5 μm), or ≥9 μm, or ≥12 μm, or ≥15 μm.

In an embodiment, some or all of the second and third contact zones (e.g. bondpads) have a shape encompassing an overall rectangular shape with a length and a width≤45 μm (i.e. a length≤45 μm and a width≤45 μm), or ≤40 μm, or ≤35 μm, or ≤30 μm, or ≤25 μm, or ≤20 μm, or ≤18 μm, or ≤15 μm. The length and the width may be ≥5 μm (i.e. the length≥5 μm and the width≥5 μm), or ≥9 μm, or ≥12 μm, or ≥15 μm.

In an embodiment, step d) comprises providing a passivation layer (e.g. a polyimide layer) on top of the active surfaces, and patterning this passivation layer to open bondpads.

The method described above, wherein a reconstituted wafer is built using known good dies (KGD), followed by RDL build-up on top of the reconstituted wafer is known as the "chip-first/SDL-last" fan-out wafer level packaging (FOWLP) approach.

In an embodiment, step d) comprises electroplating (e.g. using copper) in a photoresist mould or etching in order to provide said electrical couplings (e.g. by means of copper connections).

In an embodiment, step d) comprises depositing a metal layer (e.g. aluminium) and providing said electrical couplings by etching said metal layer.

Preferably step e) is performed at a temperature of at most 350° C., or at most 300° C.

The method may further comprise the step of removing the base plate.

In an embodiment, step c) may further comprise the step of bonding the reconstituted wafer to a temporary carrier coated with a release layer and a bonding material; and step d) may further comprise the step of: debonding the carrier and cleaning the bonding material.

In an embodiment, the method further comprising providing a second passivation layer (e.g. a polyimide layer); and opening the second passivation layer for forming electrical connections to a subset of bond-pads or connection zones of the first substrate (e.g. a supply and ground voltage, a communication interface or an output); and providing a noble metal (e.g. silver or gold) in said opening therefore forming said external terminals.

In an embodiment, the method further comprises a step of singulating (or separating) individual sensor devices by sawing or by laser cutting.

In an embodiment, the method further comprises a step of testing or verifying the individual sensor devices at wafer level, before the step of singulation. Testing at wafer level requires much less handling and is therefore much more efficient.

According to a third aspect, the present invention also provides a current sensor system, comprising: an electrical conductor (e.g. a busbar) configured for conducting a current to be measured; a magnetic sensor device according to the first aspect, arranged in the vicinity to the electrical conductor, and configured for measuring two magnetic field components of a magnetic field generated by said current when flowing through said electrical conductor, and for determining a difference of these magnetic field components, and for determining the current to be determined as a value proportional to said magnetic field difference.

In an embodiment, the magnetic field difference $\Delta Bz$ is multiplied by a constant K which is hardcoded, or which is stored in a non-volatile memory of the sensor device.

The electrical conductor is located outside of the magnetic sensor device.

According to a fourth aspect, the present invention also provides a magnetoelastic torque sensor system, comprising: a shaft comprising: a first axial section that is magnetized in a first circumferential direction, and a second axial section that is magnetized in a second circumferential direction, opposite the first circumferential direction; a magnetic sensor device according to the first aspect, arranged in the vicinity of the shaft, and configured for measuring two magnetic field components of a magnetic field generated by said shaft when a torque is exerted on the shaft, and for determining a difference of these magnetic field components, and for determining the torque to be measured, as a function of said difference.

Such a magnetoelastic torque sensor is based on a reversal of the physical effect of magnetostriction (deformation of magnetic materials by means of an applied magnetic field), wherein a torque, which impacts on the magnetized shaft, causes a torsion of the shaft and as a consequence a modification of the magnetic field outside of the shaft. This modification is very sensitive with regard to the extent of the torque and can be measured with the magnetic field sensor.

In an embodiment the sensor device has two magnetic sensors, configured for measuring magnetic field components (e.g. Bax1, Bax2) oriented in the axial direction parallel to the shaft, and spaced apart over a predefined distance (e.g. dx) corresponding to an axial distance between a centre (e.g. m1) of the first axial section and a centre (e.g. m2) of the second axial section.

In an embodiment the sensor device has two magnetic sensors, configured for measuring magnetic field components (e.g. Brad1, Brad2) oriented in a radial direction of the shaft, and spaced apart over said predefined distance (e.g. dx).

Particular and preferred aspects of the invention are set out in the accompanying independent and dependent claims. Features from the dependent claims may be combined with features of the independent claims and with features of other dependent claims as appropriate and not merely as explicitly set out in the claims. These and other aspects of the invention will be apparent from and elucidated with reference to the embodiment(s) described hereinafter.

BRIEF DESCRIPTION OF THE DRAWINGS

FIG. 1A is a top view and FIG. 1B is a cross-sectional view of the magnetic sensor device of FIG. 1A along the line A-A.

FIG. 3 shows a flow-chart of a method of producing a magnetic sensor device like the one shown in FIG. 1A and FIG. 1B.

FIG. 4(a) to FIG. 4(j) illustrate in more detail various steps of a method of producing a magnetic sensor device like the one shown in FIG. 1A and FIG. 1B.

Figure 1A:
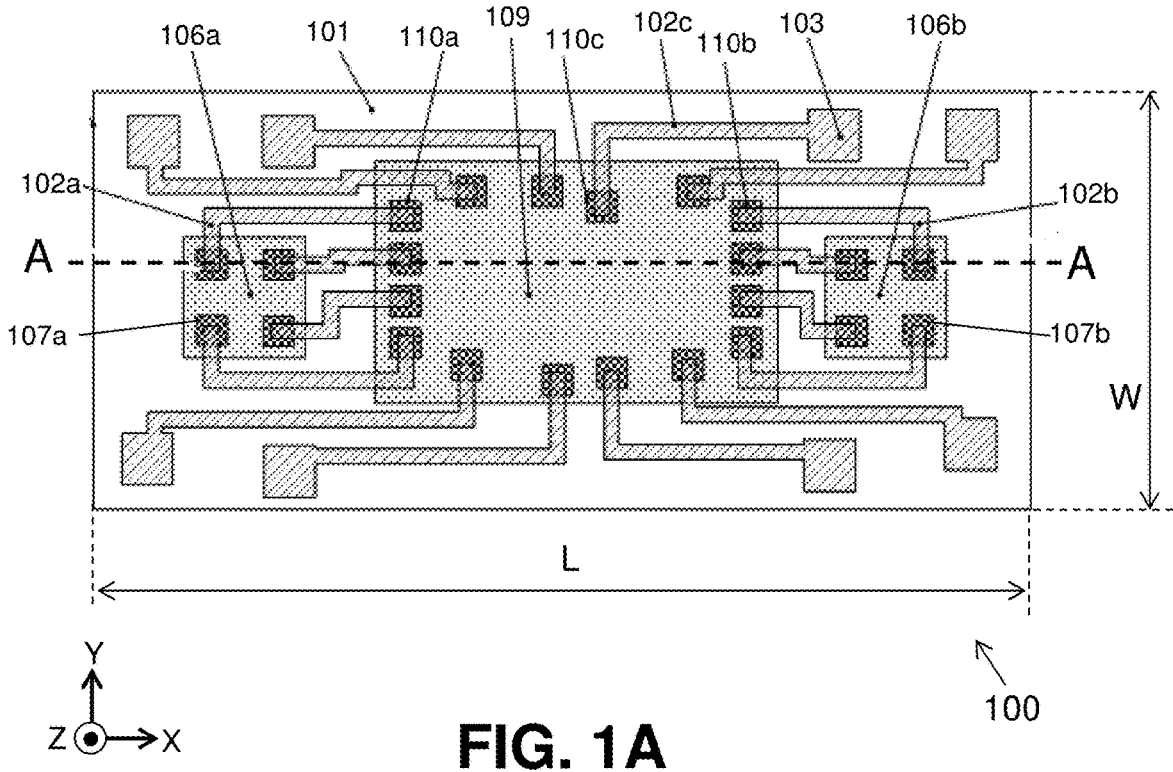
FIG. 1A and FIG. 1B show an illustrative example of a magnetic sensor device according to an embodiment of the present invention.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

The terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some, but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document, the abbreviation "RDL" means "Redistribution Layer(s)".

In this document, the abbreviation "IMC" means "Integrated Magnetic Concentrator".

In this document, the abbreviation "SNR" means "Signal to Noise Ratio".

In this document, the abbreviation "MR element" means "Magneto-Resistive element".

In this document, the term "magnetic sensor device" or "sensor device" refers to a device comprising three semiconductor substrates integrated in a single package and arranged next to each other.

Embodiments of the present invention are typically described using an orthogonal coordinate system which is fixed to the sensor device, and having three axes X, Y, Z, where the X and Y axis are parallel to the substrate, and the Z-axis is perpendicular to the substrate. The X-axis may be defined by a first and a second sensor location.

In this document, the term "magnetic sensor" may refer to a 1D magnetic pixel, or a 2D magnetic pixel, or a 3D magnetic pixel.

A "1D magnetic pixel" is capable of measuring a single magnetic field component, and may comprise for example a single vertical Hall element or a single horizontal Hall element or a single magneto-resistive (MR) element (e.g. a GMR element or an XMR element).

A "2D magnetic pixel" is capable of measuring two orthogonal magnetic field components at the sensor location. A 2D magnetic pixel may comprise for example a horizontal Hall element and one vertical Hall element, or a circular IMC with two horizontal Hall elements arranged near the periphery of the IMC and angularly spaced by 180°.

A "3D magnetic pixel" is capable of measuring three orthogonal magnetic field components at the sensor location. A 3D magnetic pixel may comprise for example a horizontal Hall element and two vertical Hall elements oriented in orthogonal directions, or a circular IMC with four horizontal Hall elements arranged near the periphery of the IMC and angularly spaced by 90°.

In this document, the expression "spatial derivative" or "derivative" or "spatial gradient" or "gradient" are used as synonyms. In the context of the present invention, a gradient is typically determined as a difference between two magnetic field component values measured at two different locations which are spaced apart by a predefined distance. In theory the gradient is calculated as the difference between two values divided by the distance "dx" between the sensor locations, but in practice the division by "dx" is often omitted, because the measured signals need to be scaled anyway.

For this reason, the terms "magnetic field gradient" and "pairwise difference" can be used interchangeably.

The present invention relates in general to the field of magnetic sensor devices for use in E-bikes, automotive applications, industrial applications, and/or robotic applications, and methods of producing them.

The inventors of the present invention were faced with the problem of having to accurately measure a magnetic field in a manner that is highly insensitive to an external disturbance field. More specifically, the inventors were asked to find a cost-effective solution for one or both of the following specific problems:

(a) to accurately measure a current flowing through a busbar having a width in the range from about 2.5 mm to about 5.0 mm or even up to 10.0 mm;

(b) to accurately measure a torque exerted on a shaft of an E-bike, the shaft comprising a first axial section that is magnetized in a first circumferential direction, and a second axial section that is magnetized in a second circumferential direction, opposite the first circumferential direction. The first and second axial section may be axially spaced apart by a distance of at least 5.0 mm or at least 10.0 mm.

The present invention proposes a packaged device comprising at least three separate semiconductor substrates, including: a first semiconductor substrate, and a plurality of sensor substrates. The first semiconductor substrate (also referred to herein as "main substrate") has an active surface comprising (at least) a processing circuit for processing sensor signals. The first semiconductor substrate is preferably a CMOS substrate. The plurality of sensor substrates are configured for providing a plurality of sensor signals, and comprise at least: a second semiconductor substrate (also referred to herein as "first sensor substrate") and a third semiconductor substrate (also referred to herein as "second sensor substrate"). The second semiconductor substrate (i.e. the first sensor substrate) has an active surface comprising a first magnetic sensor. The third semiconductor substrate has an active surface comprising a second magnetic sensor. The first magnetic sensor is configured for providing at least a first sensor signal. The second magnetic sensor is configured for providing at least a second sensor signal.

Importantly, the sensor device is a wafer-level packaged device; the first substrate is situated at a location between the plurality of sensor substrates; the first semiconductor substrate is electrically connected to each of the sensor substrates by means of at least one redistribution layer (RDL); and the processing circuit is configured for receiving said plurality of sensor signals or signals derived therefrom (e.g.

after amplification and/or digitization), and for determining at least one difference between said signals, and for providing an output signal derived from said at least one difference.

It is an advantage that this sensor device is a single package, because that simplifies mounting thereof relative to another object (as compared to a solution consisting of two separate devices), such as e.g. a bus-bar, or a torque bar.

It is a major advantage of having at least three separate semiconductor substrates, that they can be manufactured separately, e.g. using different materials and/or using different technologies or processes, and/or using different scaling. This allows for example to combine a processing circuit implemented in one material and/or in one technology node, and sensors implemented in another material and/or in another technology node. This also allows for example to combine a processing circuit implemented in CMOS technology, and sensors implemented in GaAs or InAs.

It is an advantage of arranging the three substrates next to each other. By doing so, the risk of one substrate exerting mechanical stress on another substrate can be avoided, e.g. as may be the case when they are mounted on top of each other, and the substrates expand in different ways e.g. due to thermal dissipation.

It is a major advantage of this device that it allows one substrate to be "shrinked" (e.g. the processing substrate) without modifying the position and/or the size of the sensors.

Depending on the number and kind of sensor elements (e.g. 1D, 2D, 3D magnetic pixel) and on the specific algorithm implemented in the processing circuit, this sensor device can be configured to operate for example as a current sensor device, or as a torque sensor device.

By situating the substrates next to each other, projections of the substrates in a direction perpendicular to the substrates do not overlap each other. This simplifies the routing of the interconnections.

The package may have a mainly rectangular shape (as seen from a direction perpendicular to the active surfaces).

This sensor device offers a combination of the following advantages: (1) it allows heterogeneous integration; (2) allows an increased distance between the sensor elements independent of the size of the main substrate, hence increased difference signal, thus higher accuracy; (3) cost-effective package; (4) allows to develop a "custom device" for a particular application (e.g. as a current sensor for a particular bus-bar having a particular width without redesign and testing and production of the CMOS substrate; (5) in case of chip-shortages of the sensor substrates, other sensor substrates can be used). In other words, this wafer-level package provides a great flexibility in the design and allows to use and re-use existing substrates for various applications.

It is an advantage of using a good thermal conducting material (such as copper) that the at least one redistribution layer (RDL) also serves as a heat spreader. In this way, a temperature difference between the main substrate and the sensor substrates is limited. This allows the temperature of the sensor substrates to be approximated by a temperature measured by a temperature sensor situated on the main substrate.

The "magnetic field difference" may be determined in the analogue domain, in the digital domain, or partly in the analog domain and partly in the digital domain.

In preferred embodiments, the sensor substrates are configured to receive a biasing voltage and/or a biasing current from the first substrate, and to provide an output of the sensor circuit (e.g. an output of a Hall plate or an output of a Wheatstone bridge) to the first substrate for further processing.

Referring now to the Figures.

Figure 1B:
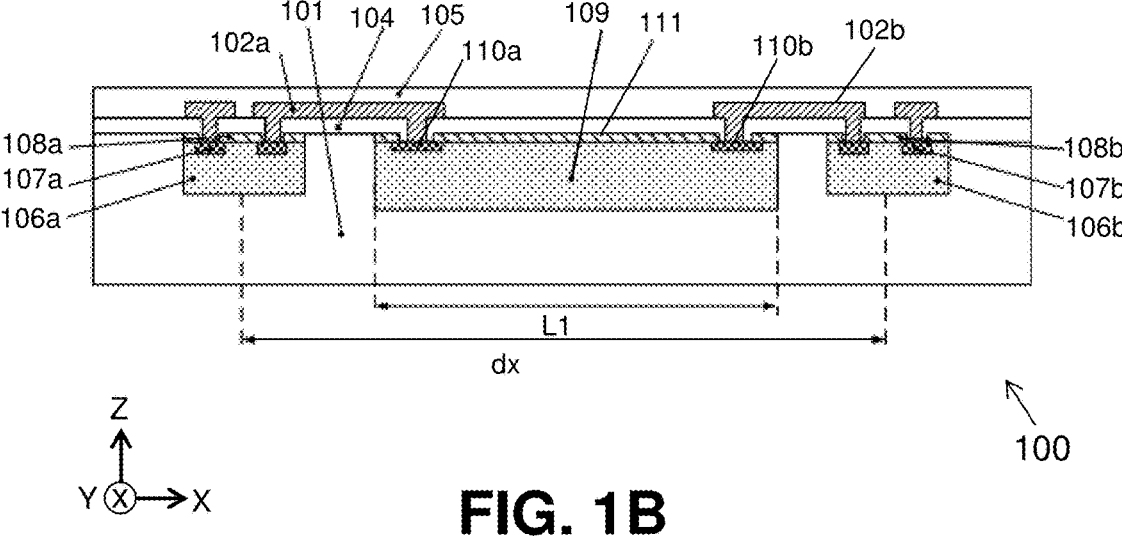

FIG. 1A and FIG. 1B show an illustrative example of a magnetic sensor device 100. FIG. 1A shows a planar view and FIG. 1B shows a cross-sectional view of the magnetic sensor device of FIG. 1A along the line A-A.

The device 100 contains three discrete semiconductor substrates: a first substrate 109, also referred to herein as the "main substrate", and two sensor substrates 106a, 106b. The sensor substrates each comprise a magnetic sensor (not explicitly shown).

The three substrates are surrounded by and held in place by means of a moulding compound 101, e.g. an epoxy.

In order to keep the description simple, it will be assumed that each sensor is a single horizontal Hall element, but of course, the present invention is not limited thereto, and may comprise other magnetic sensors, or two connected horizontal Hall elements, or a plurality of Hall elements, optionally with IMC, or one or more vertical Hall elements, or a Wheatstone bridge with at least one MR element, etc. As is well known in the art, a Horizontal Hall element typically has two "excitation nodes" where a voltage or a current is applied, and two "output nodes" where an output signal, e.g. an output voltage can be measured, thus requiring four contacts in total. Likewise, a Wheatstone bridge also has two excitation nodes and two output nodes, and thus also requires four contacts. Other magnetic sensors (e.g. an IMC with two horizontal Hall elements) may have more than four contacts, as is well known in the art. In the example of FIG. 1A, the sensor substrate 106a has four contacts, e.g. in the form of bondpads 107a, and the sensor substrate 106b has four contacts, e.g. in the form of bondpads 107b. Of course, in other embodiments, the number of contacts may be more than four, or less than four, e.g. three.

The four contacts 107a of the first sensor substrate 106a are electrically connected with four contacts 110a of the main substrate 109 by means of four electrical interconnections 102a implemented in one or more redistribution layers (RDL), also referred to herein as "RDL stack". Likewise, the four contacts 107b of the second sensor substrate 106b are electrically connected with four contacts 110b of the main substrate 109 by means of four electrical interconnections 102b implemented in said one or more RDL layer(s). In the case of a horizontal Hall element, the main substrate 109 may provide a biasing voltage or a biasing current over two of these contacts, and may read the sensor signal over the other two contacts. But of course, a more complex biasing and readout scheme may also be used, e.g. using the so called spin-current technique.

Figure 4E:
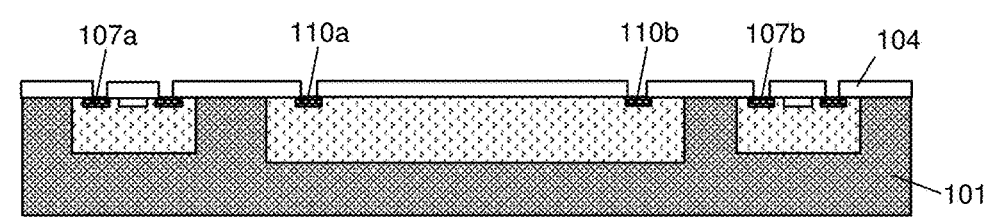
Figure 4F:
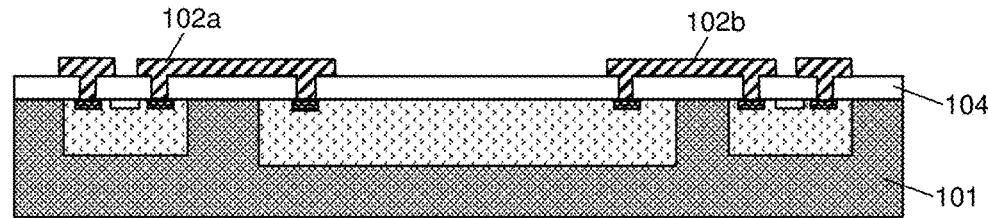
Figure 4G:
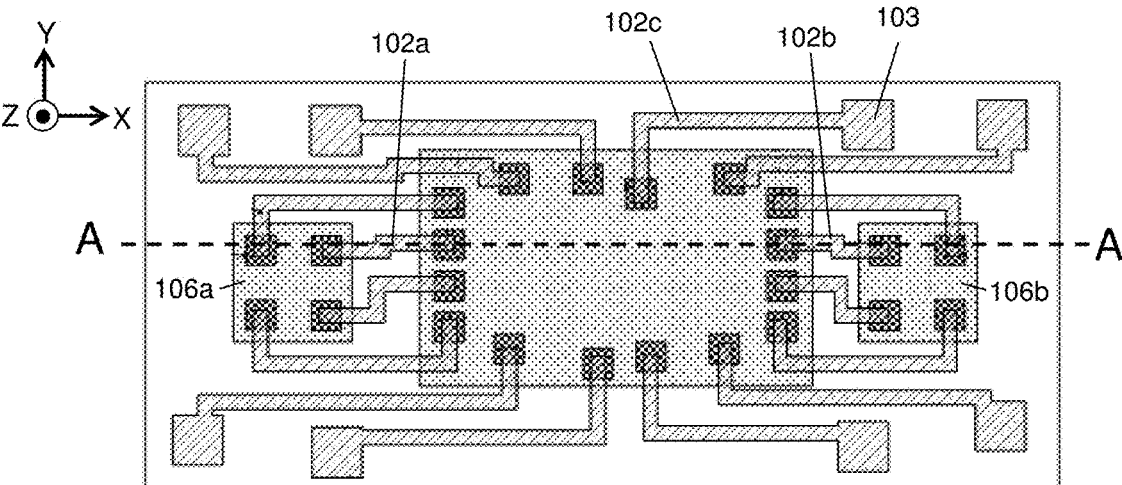
Figures 4H, 4I, 4J:
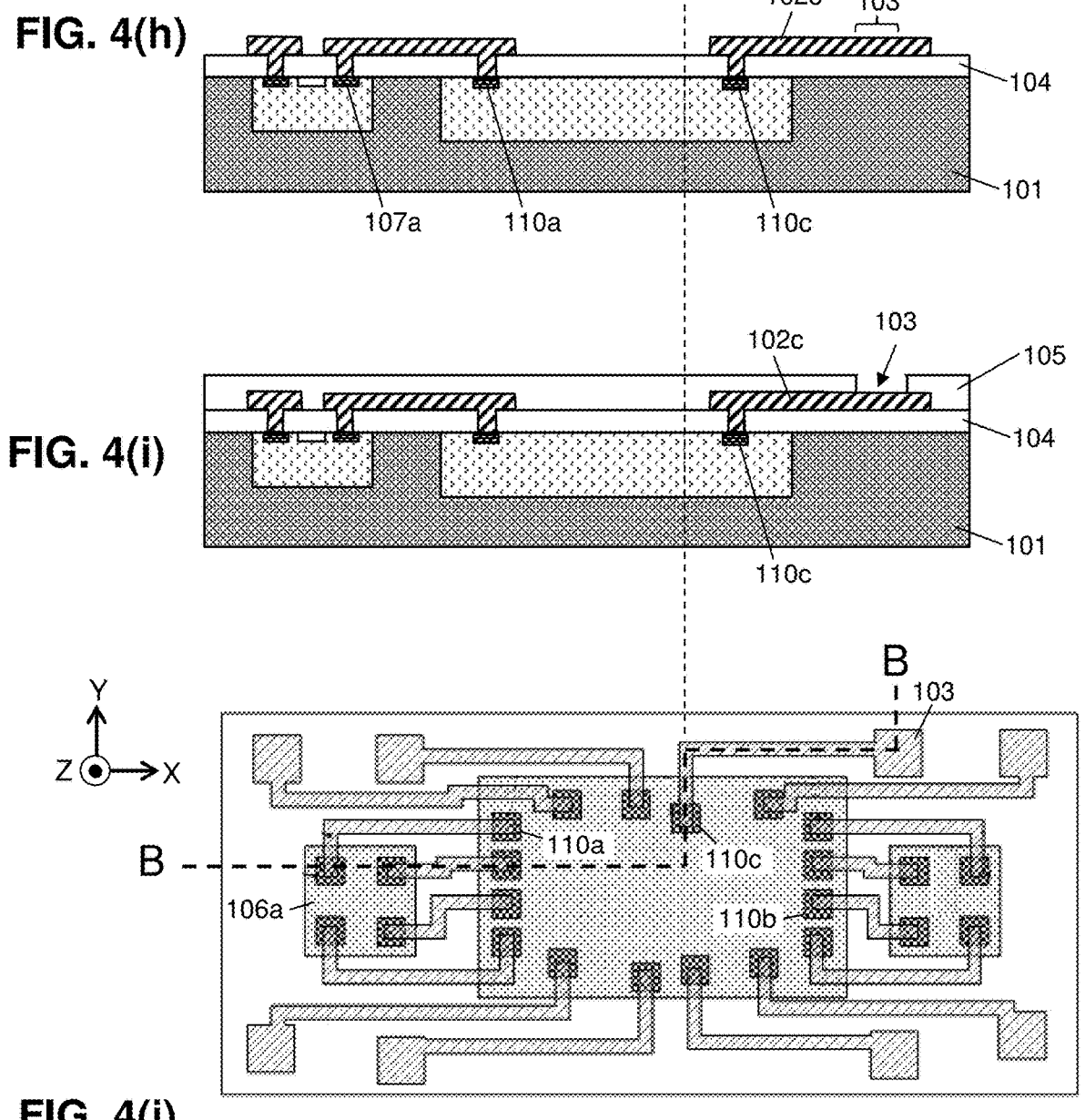

In the example of FIG. 1A, the main substrate 109 also has a plurality of contacts (e.g. bondpads) 110c leading to a plurality of contact zones 103 via interconnections 102c formed in the at least one RDL layer. The contact zones 103 can be used to form external terminals of the packaged device 100, as will be described further, e.g. in FIG. 4(h) and FIG. 4(j).

The principles used in the device 100 allow to make a different trade-off between the following conflicting requirements:

i) providing a (relatively) small CMOS chip (e.g. having a length and width smaller than the distance "dx" between the sensors);

ii) measuring a magnetic field difference or gradient having a relatively large magnitude (e.g. of at least 10 mT), by increasing the distance "dx" between the sensors;

iii) providing a single packaged device (thus avoiding external wires);

In fact, the proposed solution also offers the following (optional) advantages:

iv) it allows to "customize" the distance between the sensors at the packaging stage, without having to redesign any of the three substrates. This allows to optimize a solution for series of much smaller quantities.

v) it is even possible to use sensors having a sensitivity higher than that of CMOS sensors, by using different sensor substrates (e.g. Ga—As or In—As).

FIG. 1B shows that the three semiconductor substrates 109, 106a, 106b are arranged next to each other. In preferred embodiments, the substrates are arranged such that their "active surfaces" are coplanar, even if the first substrate has a thickness (in the Z-direction) different from the sensor substrates. The layers 108a, 111, 108b are passivation layers on top of the first sensor substrate 106a, on top of the first substrate 109, and on top of the second sensor substrate 106b respectively. The layer 104 is a first passivation layer of the RDL-stack, and the layer 105 is a second passivation layer of the RDL-stack. The tracks 102 are preferably copper tracks or aluminium tracks. They provide a good electrical and thermal contact between contact areas (e.g. bondpads) of the sensor substrates and contact areas (e.g. bondpads) of the main substrate. The packaged device may have a mainly rectangular shape (as seen from a direction perpendicular to the substrates).

In the example shown in FIG. 1A and FIG. 1B, the first substrate 109 is situated in the middle between the two sensor substrates 106a, 106b, but that is not absolutely required for the invention to work.

Figure 2:
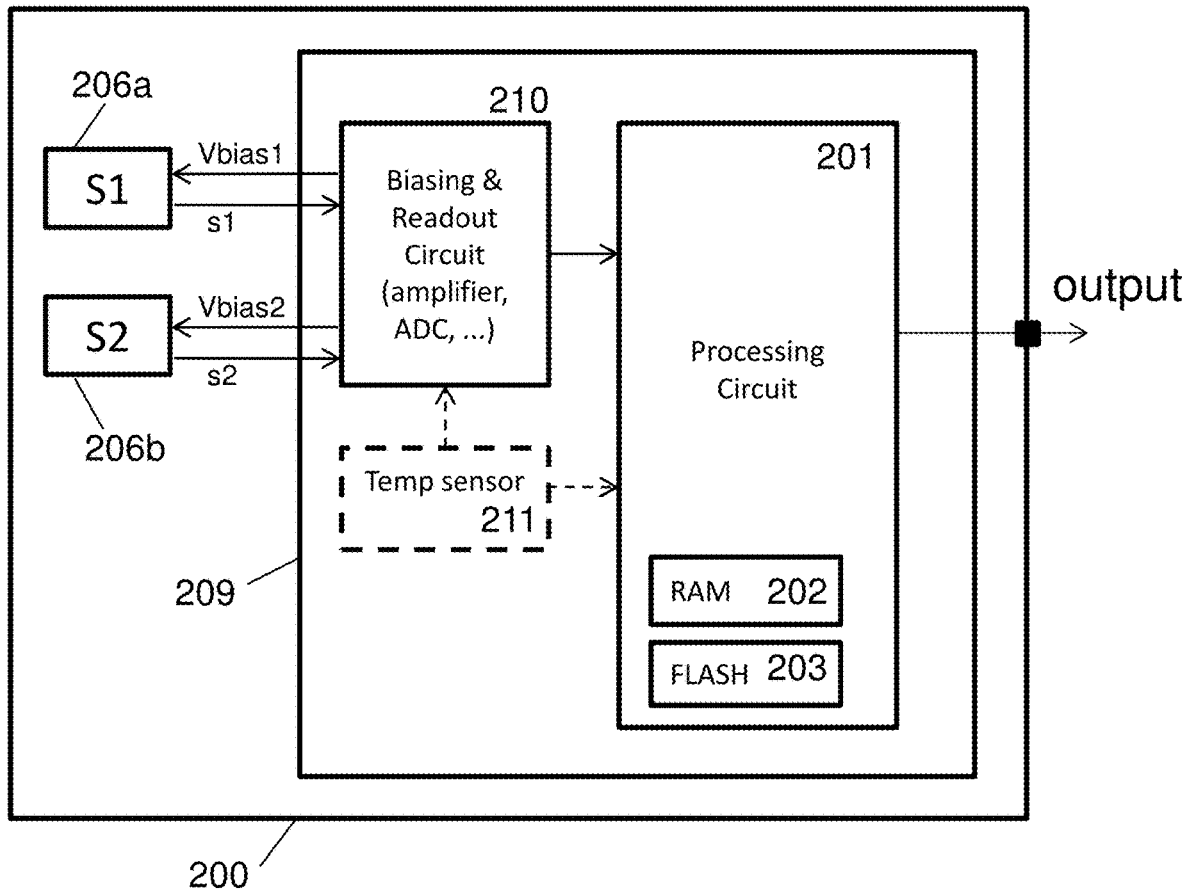
FIG. 2 is a functional block-diagram of the magnetic sensor device of FIG. 1A and FIG. 1B.

FIG. 2 is an illustrative functional block-diagram of the magnetic sensor device of FIG. 1A and FIG. 1B. This is not the main aspect of the present invention but is provided for completeness.

In the example shown, the packaged device 200 comprises three substrates: a first substrate 209 comprising at least a processing circuit 201; a second substrate 206a comprising at least a first magnetic sensor S1; and a third substrate 206b comprising at least a second magnetic sensor S2.

In the example shown in FIG. 2, the first substrate 209 furthermore contains a biasing and readout circuit 210, configured for providing a first biasing voltage Vbias1 or a first biasing current to the first sensor substrate 206a, and for providing a second biasing voltage Vbias2 or a second biasing current to the second sensor substrate 206b. In response, the first sensor substrate 206a provides a first sensor signal s1 to the first substrate 209, and the second sensor substrate 206b provides a second sensor signal s2 to the first substrate 209, for further processing.

The first substrate may further comprise one or more of the following: an analog multiplexer, an amplifier for amplifying the first and the second signal s1, s2, and an analog-to-digital convertor ADC, etc.

The first substrate may also comprise a temperature sensor 211 for measuring a temperature of the first substrate 209. This temperature may be used as an indication for the temperature of the first and second sensor S1, S2, and may be used for temperature compensation of the sensor signals.

The temperature compensation may be implemented in the analog domain or in the digital domain.

In certain embodiments, when biasing the magnetic sensors with a known current, the temperature of the sensor substrates can also be estimated by measuring the resulting voltage difference over the supply nodes, and by estimating the resulting power dissipation.

In certain embodiments, the first sensor substrate may further comprise a first temperature sensor, and the second sensor substrate may further comprise a second temperature sensor, and the first sensor substrate would further provide a first temperature signal to the main substrate, and the second sensor substrate would further provide a second temperature signal to the main substrate.

The biasing source (e.g. voltage source or current source) may be an independent voltage or current source, or may be a dependent voltage or current source, e.g. as described in more detail in EP3885779(A1), incorporated herein by reference in its entirety. In order to understand the present invention, it suffices to say that the sensor signals are temperature corrected (in the analog or digital domain) before a difference between the sensor signals is calculated. As explained in EP3885779(A1), the difference may be calculated in the analog domain (i.e. before digitization) or in the digital domain (i.e. after digitization). Calculating the difference in the analog domain reduces the risk of saturating the ADC, especially in the presence of an external disturbance field.

The processing circuit 201 may comprise a programmable processor, e.g. a programmable DSP (digital signal processor).

The processing circuit 201 may also contain a non-volatile memory 203, e.g. flash memory, storing programmable instructions for the programmable processor, and also storing at least one constant K. The processing circuit may be further configured for providing an output value derived from said difference signal, e.g. calculated in according with the following formula: output=K·(s1−s2), where s1 is the first sensor signal or a signal derived therefrom, (e.g. after amplification, temperature compensation, and digitization), and s2 is the second sensor signal or a signal derived therefrom, (e.g. after amplification, temperature compensation, and digitization), and K is a predefined constant stored in the non-volatile memory.

In another or further embodiment, the non-volatile memory may store a predefined function f( ), e.g. in the form of coefficients of a polynomial, or in the form of a table, and the processing circuit may be further configured for providing an output value as a function of said difference signal, e.g. calculated in accordance with the formula: output=f(s1−s2).

This offers the advantage that the output may be a value of a current to be measured (e.g. expressed in Amps) or a value of a torque to be measured (e.g. expressed in Nm).

Many variants are possible, for example, in case the sensors S1 and S2 are 2D magnetic pixels, the sensor substrates may have more than four contacts, for example six or eight contacts, and the sensors may each provide two sensor signals instead of only one; and the biasing and readout circuitry may be adjusted accordingly.

In the example shown in FIG. 2, the biasing and readout circuit 210 is implemented on the first substrate 209, but that is not absolutely required for the invention to work, and while generally not preferred, at least a portion of the biasing and readout circuit may be implemented on the sensor substrates 206a, 206b.

In the example shown in FIG. 2, the first substrate has an optional temperature sensor 211, and the sensor substrates do not have temperature sensors, but as explained above, it is also possible to provide a temperature sensor on each of the sensor substrates.

FIG. 3 shows a flow-chart of a method 300 of producing a magnetic sensor device like the one shown in FIG. 1A and FIG. 1B. The method 300 comprises the steps of:

a) providing in step 301 a first semiconductor substrate 109 (e.g. a CMOS substrate) having an active surface comprising at least a processing circuit 201 configured for determining at least one difference (e.g. s1–s2) between signals obtained from a plurality of sensors S1, S2 or signals derived therefrom;

b) providing in step 302 a plurality of sensor substrates (e.g. GaAs or InAs substrates) comprising at least a second and a third semiconductor substrate, the second semiconductor substrate 106a having an active surface comprising a first magnetic sensor S1, and the third semiconductor substrate 106b having an active surface comprising a second magnetic sensor S2;

c) arranging in step 303 the first semiconductor substrate 109 at a location situated between the plurality of sensor substrates 106a, 106b;

d) electrically connecting in step 304 the first semiconductor substrate 109 to each of the sensor substrates 106a, 106b by means of at least one redistribution layer (RDL), or by means of an RDL-stack.

In some embodiments, step c) may further comprise: mechanically connecting the first, second and third substrate to a carrier substrate.

In a variant of this method, first an RDL stack is formed, and subsequently the three substrates are mounted on the RDL stack, and electrically connected thereto.

FIG. 4(*a*) to FIG. 4(*j*) illustrate in more detail various steps of a method of producing a magnetic sensor device like the one shown in FIG. 1A and FIG. 1B.

Before describing the various steps, it is noted that:

FIG. 4(*g*) shows a planar view with a line A-A passing through both sensor substrates 106a, 106b. FIG. 4(*a*) to FIG. 4(*f*) show cross sectional views according to this line A-A, and that FIG. 4(*j*) shows a planar view with a line B-B passing through one sensor substrate 106a and through one terminal contact 103. FIG. 4(*h*) and FIG. 4(*i*) show cross sectional views according to this line B-B.

Now the various steps can be described:

In FIG. 4(*a*), a carrier substrate 480 is provided, e.g. a glass substrate or a metal substrate.

In FIG. 4(*b*), three semiconductor substrates are provided, including a first semiconductor substrate 109 comprising at least a processing circuit, a second semiconductor substrate 106a (also referred to as first sensor substrate) comprising at least a first sensor S1, and a third semiconductor substrate 106c (also referred to as second sensor substrate) comprising at least a second sensor S2. The first substrate 109 is preferably a Si substrate processed with a CMOS compatible process. The sensor substrates 106a, 106b may be Si substrates compatible with the CMOS process, or Si substrates incompatible with the CMOS process but providing magnetic sensor elements with a larger sensitivity than with the CMOS process, or may comprise a compound semiconductor material selected from the III-V-group, such as for example Ga—As or In—As. The substrates are placed (e.g. picked and placed) with their active surfaces facing towards the carrier substrate 480, and such that the first substrate 109 is positioned in an area between the sensor substrates 106a,

106b. A temporary bonding material may be used to temporary bond the substrates to the carrier substrate. There may be a passivation layer 108a, 108b over the active surfaces of the sensor substrates 106a, 106b (not shown here in order not to overload the drawings, but see e.g. FIG. 1B), and there may be a passivation layer 111 over the active surface of the first substrate 109 (e.g. shown in FIG. 1B).

FIG. 4(*c*) shows the structure of FIG. 4(*b*) after overmolding the substrates with an epoxy molding compound 101, and after curing.

FIG. 4(*d*) shows the structure of FIG. 4(*c*) after debonding the carrier substrate 480 and cleaning the bonding material. The result is referred to as a "reconstituted wafer". The mold compound provides structural strength.

It is an advantage that the active surfaces of the three substrates are located in a same (virtual) plane, even if the substrates have different thicknesses. This allows that many or all of the vias of the redistribution RDL layer have substantially the same length (in a direction perpendicular to the substrates), which is beneficial for the production thereof. Another advantage is that this makes it possible to mount the three substrates at a same distance from an external object in some applications.

FIG. 4(*e*) shows the structure of FIG. 4(*d*) rotated upside-down, and after providing an electrical isolation layer 104, e.g. a polyimide layer, and after patterning the isolation layer 104 to create openings for providing access to contact zones (e.g. bondpads) 107a on the first sensor substrate 106a, and openings to contact zones (e.g. bondpads) 110a, 110c, 110b on the first substrate 109, and openings to contact zones (e.g. bondpads) 107b on the second sensor substrate 106b.

FIG. 4(*f*) shows the structure of FIG. 4(*e*) after providing a patterned conductive layer (e.g. by patterning a resist and electroplating with copper) in order to provide electrical connections 102a between said contact zones 107a and 110a, and to provide electrical connections 102b between said contact zones 107b and 110b, and to create electrical connections 102c, as will be explained further.

FIG. 4(*h*) shows a cross-section of the same structure, but according to the line B-B of FIG. 4(*j*). The left side of FIG. 4(*h*) is identical to that of FIG. 4(*f*), but the right side is different.

FIG. 4(*i*) shows the structure of FIG. 4(*h*) after applying and patterning a top passivation layer 105, e.g. a second polyimide layer, forming openings to provide access to contact zones 103 formed by the electrical interconnections 102c. A noble metal (e.g. silver or gold) may be provided on top of these contact zones 103, thereby forming external terminals of the packaged device.

It is noted that FIG. 4(*a*) to FIG. 4(*j*) show only one sensor device, but in fact, this process is performed at wafer level, meaning that a relatively large number of sensor devices is formed simultaneously when performing the steps shown in FIG. 4(*a*) to FIG. 4(*j*). The method typically also comprises a step of singulation, e.g. by sawing or by laser cutting the wafer into individual sensor devices.

Figure 5:
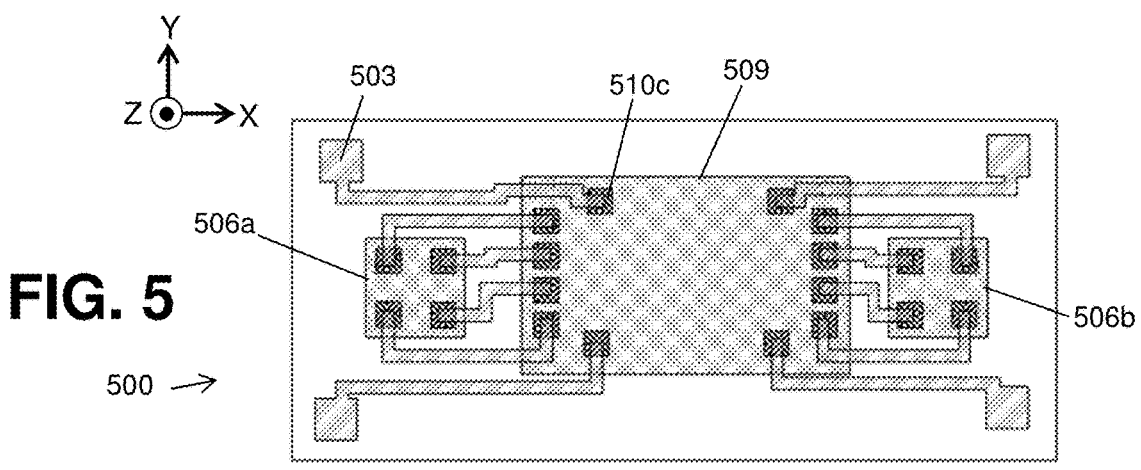
FIG. 5 shows an example of another magnetic sensor device according to an embodiment of the present invention, having only four terminals.

FIG. 5 shows an example of another magnetic sensor device 500, which can be seen as a variant of the magnetic sensor device 100 shown in FIG. 1(*a*) and FIG. 1(*b*). The main difference between the sensor device 500 of FIG. 5 and the sensor device 100 of FIG. 1(*a*) and FIG. 1(*b*) is that the sensor device 500 has only four terminals 503. These terminals may be used for example to provide a supply voltage (VDD), and a reference voltage (GND), and an output port, or a communication interface (e.g. a serial communication interface).

The two sensor substrates may each contain a 1D-magnetic sensor capable of measuring a magnetic field component in the Z-direction, and the processing circuit may be configured to further process the two sensor signals Bz1, Bz2.

As mentioned above, each of the sensor substrates may optionally further comprise a temperature sensor and be configured to provide a respective temperature signal to the main substrate.

In another or further variant of FIG. 5 (not shown), the sensor substrates are configured to measure another magnetic field component, e.g. oriented in the X-direction or the Y-direction, parallel to the semiconductor substrates.

In another variant of FIG. 5, the sensor substrates may comprise a 2D or a 3D magnetic pixel, and optionally also a temperature sensor. In this case, the number of connection zones (e.g. bondpads) and electrical interconnections may be larger than four.

Figure 6:
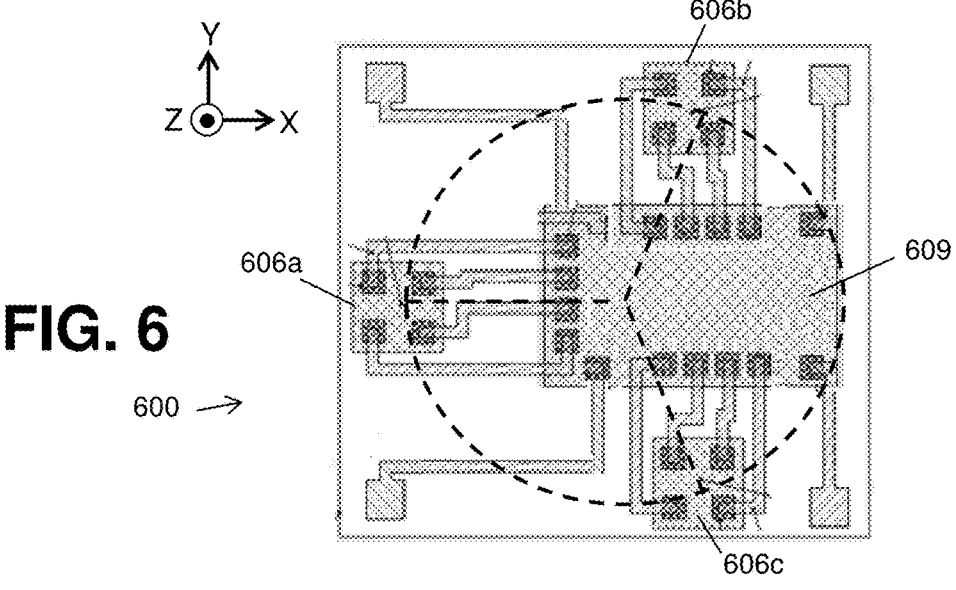
FIG. 6 shows an example of another magnetic sensor device according to an embodiment of the present invention, having a main substrate and three sensor substrates.

FIG. 6 shows an example of another magnetic sensor device 600, which can be seen as another variant of the magnetic sensor device 100 shown in FIG. 1(a) and FIG. 1(b), or as a variant of the sensor device 500 of FIG. 5. The main difference between the sensor device 600 of FIG. 6 and the sensor device 500 of FIG. 5 is that the sensor device 600 has three sensor substrates 606a, 606b, 606b instead of only two. As can be seen, the first substrate 609 is arranged at a location between the three sensor substrates 606a, 606b, 606c. While not absolutely required, the three sensor substrates may be situated on a virtual circle and may be angularly spaced apart by multiples of 120°. Preferably, a projection of the centre of the virtual circle (in the Z-direction) intersects the first substrate 609. In another embodiment, the three substrates are situated at the corners of a right-angled triangle, meaning a triangle having two legs forming an angle of 90°. The three sensor substrates may each contain a 1D-magnetic sensor capable of measuring a magnetic field component in the Z-direction, and the processing circuit may be configured to further process the three sensor signals Bz1, Bz2, Bz3.

Many variants are possible, for example the variants mentioned of FIG. 5. For example, the three sensor substrates may comprise another 1D magnetic pixel (e.g. for measuring a Bx or a By component rather than Bz), or may comprise a 2D magnetic pixel (e.g. measuring two in-plane components, or one in-plane and one out-of-plane component, or may comprise a 3D magnetic pixel.

In an embodiment, the sensor substrates are arranged at the corners of a right-angled triangle, and the sensor substrate situated at the right-angled corner is a 3D magnetic sensor, and the sensor substrates situated at the acute angles of the triangle are only 1D or 2D magnetic sensors.

In an embodiment, the sensor substrates are arranged at the corners of a right-angled triangle, and the sensor substrate situated at the right-angled corner is a 2D magnetic sensor, and the sensor substrates situated at the acute angles of the triangle are only 1D magnetic sensors.

In any of these embodiments, the sensor substrates may each comprise a temperature sensor.

Figure 7:
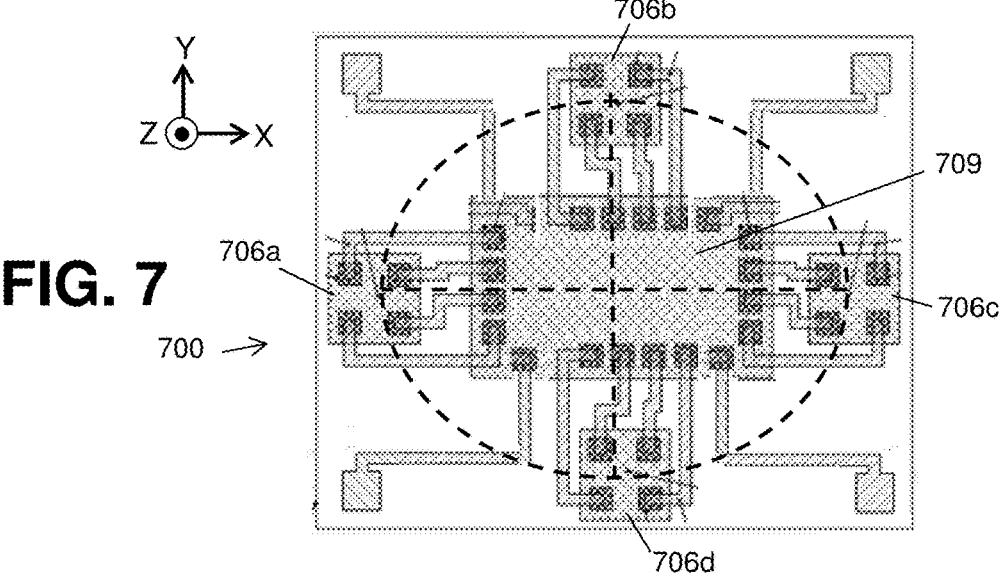
FIG. 7 shows an example of another magnetic sensor device according to an embodiment of the present invention, having a main substrate and four sensor substrates.

FIG. 7 shows an example of another magnetic sensor device 700, which can be seen as another variant of the magnetic sensor device 100 shown in FIG. 1(a) and FIG. 1(b), or as a variant of the sensor device 500 of FIG. 5. The main difference between the sensor device 700 of FIG. 7 and the sensor device 500 of FIG. 5 is that the sensor device 700 has four sensor substrates 706a, 706b, 706c, 706d instead of only two. As can be seen, the first substrate 709 is arranged at a location between the four sensor substrates. While not absolutely required, the four sensor substrates may be situated on a virtual circle or a virtual ellipse and may be angularly spaced apart by multiples of 90°. Or stated in other words, the four sensors may be located at the corners of a virtual square or a virtual diamond. Preferably, a projection of the centre of the virtual circle (in the Z-direction) intersects the first substrate 709. The four sensor substrates may each contain a 1D-magnetic sensor capable of measuring a magnetic field component in the Z-direction, and the processing circuit may be configured to further process the four sensor signals Bz1, Bz2, Bz3, Bz4.

Again, many variants are possible. For example, the sensor substrates may comprise another 1D magnetic pixel (e.g. for measuring a Bx or a By component rather than Bz; or for measuring a component oriented towards the center of the virtual circle), or may comprise 2D magnetic pixels (e.g. measuring two in-plane components, or one in-plane component and one out-of-plane component, or may comprise a 3D magnetic pixel.

In an embodiment, the sensor substrates are arranged at the corners of the package (instead of near the middle of the sides of the package). In this way, the distance between the sensor substrates is increased without increasing the size of the packaged device.

In any of these embodiments, the sensor substrates may each comprise a temperature sensor.

Figure 8A:
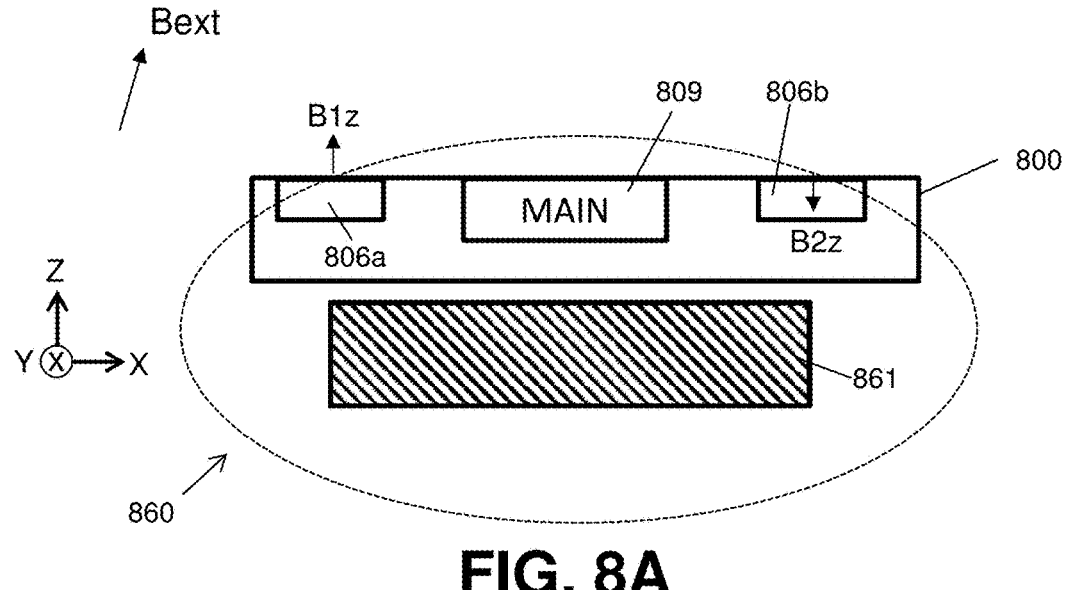
FIG. 8A and FIG. 8B shows an example of a current sensor system as another embodiment of the present invention.
Figure 8B:
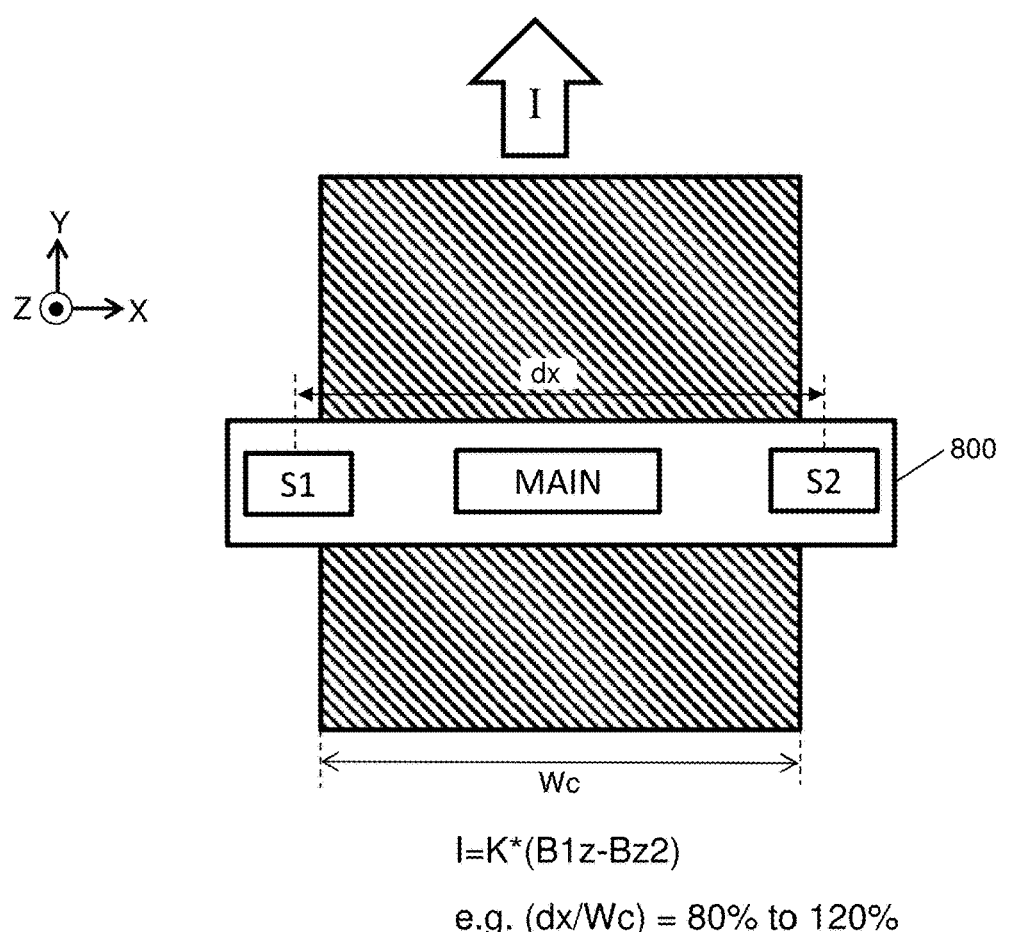

FIG. 8A and FIG. 8B shows an example of a current sensor system 860 as another embodiment of the present invention, in cross sectional view, and in top view, respectively. The current sensor system 860 comprises an electrical conductor, e.g. a busbar 861; and a magnetic sensor device 800 as described above, arranged in the vicinity to the electrical conductor. The electrical conductor 861 is situated outside of the packaged sensor device 800 and may be arranged on top of the electrical conductor, or at a small distance therefrom. The magnetic sensor device 800 has a first substrate 809 and two sensor substrates 806a, 806b, configured for measuring a first and a second magnetic field component Bz1, Bz2 of a magnetic field generated by a current to be measured, when flowing through said conductor. The magnetic sensor device 800 is further configured for determining a difference (ΔBz) of these magnetic field components, and for determining the current (I) to be measured as a value proportional to said magnetic field difference, e.g. in accordance with the formula: $I=K*(Bz1-Bz2)$, where the value of K is a predefined constant, which may be hardcoded, or which is stored in a non-volatile memory 203 of the sensor device 800.

In preferred embodiments, the conductor has a width We of at least 3.0 mm, or at least 5.0 mm, or at least 7.5 mm, or at least 10 mm, and a ratio R of the distance "dx" between a magnetic centre of the first sensor S1 and the second sensor S2 (e.g. the geometric centre of a horizontal Hall element), and the width "Wc" of the magnetic conductor is a value in the range from 80% to 120%, or in the range from 90% to 110%, or in the range from 95% to 105%. Or written mathematically: $R=dx/Wc=80\%$ to 120%. Thus, the distance dx between centres of the first and second magnetic sensor can be customized for a particular conductor.

Figure 9:
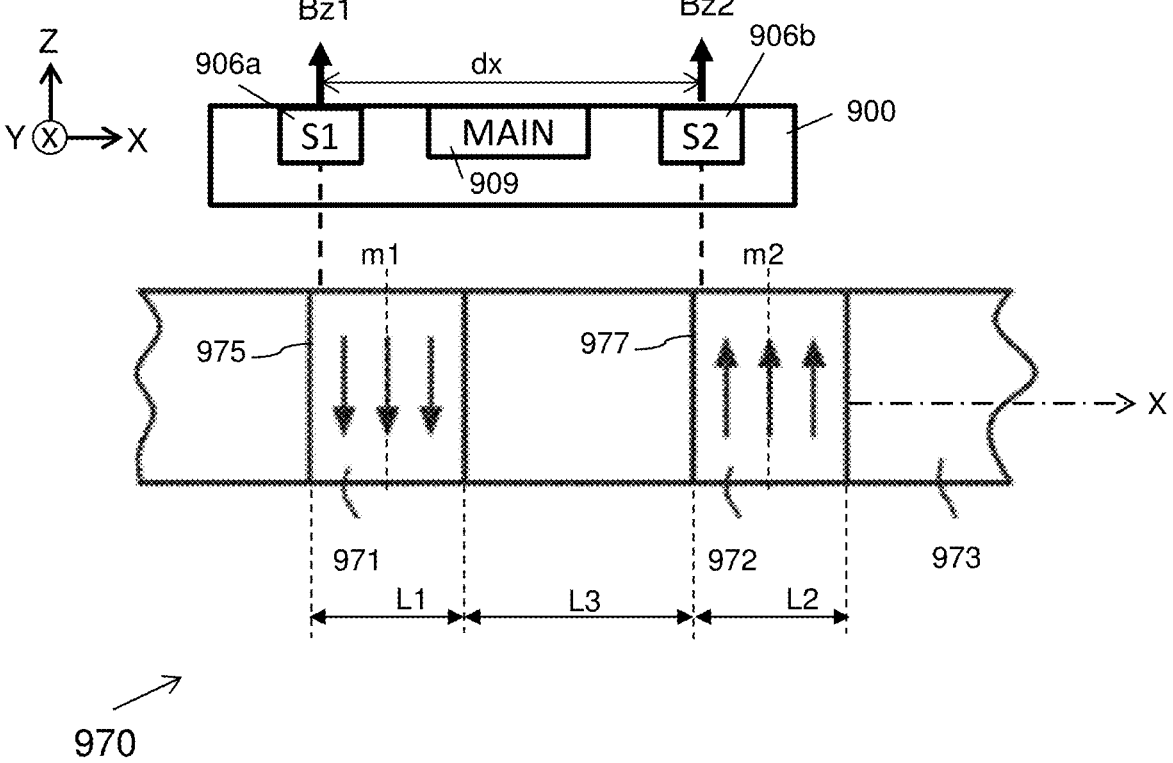
FIG. 9 shows an example of a torque sensor system as another embodiment of the present invention.

FIG. 9 shows an example of a magnetoelastic torque sensor system 970 as another embodiment of the present invention. The magnetoelastic torque sensor system comprises: a shaft 973 comprising a first axial section 971 that is magnetized in a first circumferential direction (e.g. counter-clockwise), and a second axial section 972 that is magnetized in a second circumferential direction (e.g. clockwise), opposite the first circumferential direction. Such a magnetoelastic torque sensor is based on a reversal of the physical effect of magnetostriction (deformation of magnetic materials by means of an applied magnetic field), wherein a torque, which impacts on the magnetized shaft, causes a torsion of the shaft and as a consequence a modification of the magnetic field outside of the shaft. This modification is very sensitive with regard to the extent of the torque and can be measured with the magnetic field sensor. The magnetoelastic torque sensor system 970 further comprises: a magnetic sensor device 900 as described above, arranged in the vicinity of the shaft.

The magnetic sensor device may be configured for measuring two magnetic field components of a magnetic field generated by said shaft when a torque is exerted on the shaft, e.g. Bz 1 at the first sensor location, and Bz2 at the second sensor location, both oriented in a radial direction with respect to the shaft. The magnetic sensor device 900 may be arranged such that the first magnetic sensor S1 is situated at an axial position close to an edge 975 of the first axial zone 971, and such that the second magnetic sensor S2 is situated at an axial position close to an edge 977 of the second axial zone 972. The magnetic sensor device 900 is further configured for determining a magnetic field difference $\Delta$Bz of these magnetic field components Bz1, Bz2, and for determining the torque (T) to be measured as a function of said magnetic field difference, e.g. in accordance with the formula: $T=K*(Bz1-Bz2)$, where K is a predefined constant, which may be determined be design, by simulation, or by calibration. The value of K may be stored in a non-volatile memory of the sensor device 900. The sensors S1, S2 may comprise one or more horizontal Hall elements, for example may each comprise two orthogonally biased horizontal Hall elements.

Alternatively (not shown), the magnetic sensor device is configured for measuring two magnetic field components of said magnetic field, e.g. Bx1 at a first sensor location, and Bx2 at the second sensor location, oriented parallel to the shaft. This magnetic sensor device may be arranged such that the first magnetic sensor S1 is situated near the middle m1 of the first axial zone 971, and such that the second magnetic sensor S2 is situated at an axial position near the middle m2 of the second axial zone 972. This magnetic sensor device is configured for determining a magnetic field difference $\Delta$Bx of these magnetic field components Bx1, Bx2, and for determining the torque (T) to be measured as a function of said magnetic field difference, e.g. in accordance with the formula: $T=K*\Delta Bx$, where $\Delta Bx=(Bx1-Bx2)$, and where K is a predefined constant, which may be stored in a non-volatile memory of the sensor device 900. The sensors S1, S2 may comprise one or more vertical Hall elements, or a Wheatstone-bridge with one or more magneto-resistive elements, or a disk-shaped magnetic concentrator with two horizontal Hall elements.

In both cases, the magnetic sensors are spaced apart by a distance dx. Assuming the first axial zone 971 extends over an axial length L1, and the second axial zone 972 extends over an axial length L2, and the first and the second axial zone are spaced apart by an axial distance L3, the distance dx is preferably equal to about (L1+L3). Thus, the distance dx between centres of the magnetic sensors can be customized for a particular shaft.

The first semiconductor substrate may be a silicon substrate, e.g. a CMOS substrate. The sensor substrates may comprise a compound semiconductor material selected from the III-V-group, such as for example Ga—As or In—As. Such sensors have a higher sensitivity than a CMOS substrate.

The invention claimed is:

1. A magnetic sensor device comprising:
   a first semiconductor substrate having an active surface comprising a processing circuit for processing sensor signals;
   a plurality of sensor substrates configured for providing a plurality of sensor signals, comprising at least:
   a second semiconductor substrate having an active surface comprising a first magnetic sensor configured for providing at least a first sensor signal, and a third semiconductor substrate having an active surface comprising a second magnetic sensor configured for providing at least a second sensor signal;
   wherein
   the sensor device is a wafer-level packaged device having a plurality of external terminals;
   the first substrate is situated at a location between the plurality of sensor substrates;
   the first semiconductor substrate is electrically connected to each of the sensor substrates by means of at least one redistribution layer;
   the first semiconductor substrate is electrically connected to the plurality of external terminals by means of said at least one redistribution layer;
   the processing circuit is configured for receiving said plurality of sensor signals or signals derived therefrom, and for determining at least one difference between said signals, and for providing an output signal derived from said at least one difference.

2. The magnetic sensor device according to claim 1, wherein the number of redistribution layers is only one or only two.

3. The magnetic sensor device according to claim 1, wherein the first semiconductor substrate mainly comprises silicon; and
   wherein the second and third semiconductor substrate mainly comprise silicon, and/or are discrete silicon substrates.

4. The magnetic sensor device according to claim 1, wherein the first semiconductor substrate mainly comprises silicon; and
   wherein the second and third semiconductor substrate comprise a compound semiconductor material selected from the III-V-group.

5. The magnetic sensor device according to claim 1, wherein the first substrate further comprises a temperature sensor for measuring a temperature of the main substrate, and
   wherein the processing circuit is configured for temperature correcting the sensor signals before determining said difference, based on the measured temperature.

6. The magnetic sensor device according to claim 1, wherein each of the sensor substrates further comprises a temperature sensor for measuring a temperature of said sensor substrate, and
   wherein the processing circuit is configured for temperature correcting the sensor signals before determining said difference, based on these temperature signals.

7. The magnetic sensor device according to claim 1, wherein the sensors of the sensor substrates are substantially located on a virtual circle, and wherein:
   the number of sensor substrates is two, and the sensors are located 180° apart; or
   the number of sensor substrates is three, and the sensors are located 120° apart; or
   the number of sensor substrates is four, and the sensors are located 90° apart; or the number of sensor substrates is three, and the sensors are located 90° apart.

8. The magnetic sensor device according to claim 7, wherein the first substrate comprises an additional magnetic sensor.

9. The magnetic sensor device according to claim 1, wherein the active surface of the first substrate and the active surfaces of the plurality of sensor substrates are situated in a single plane.

10. The magnetic sensor device according to claim 1, wherein the active surface of the first substrate comprises a plurality of first contact zones, the active surface of the second substrate comprises a plurality of second contact zones, and the active surface of the third substrate comprises a plurality of third contact zones; and wherein the at least one redistribution layer interconnects a first subset of the first contact zones with the second contact zones, and interconnects a second subset of the first contact zones with the third contact zones; and wherein at least some or all of the first, second, and third contact zones have a shape encompassing an overall rectangular shape with a length≤45 μm and a width≤45 μm.

11. A method of producing a magnetic sensor device according to claim 1, comprising the steps of:

a) providing a first semiconductor substrate having an active surface comprising at least a processing circuit configured for receiving a plurality of sensor signals, and for determining at least one difference between these sensor signals or signals derived therefrom, and for providing an output signal derived from said at least one difference;

b) providing a plurality of sensor substrates comprising at least a second and a third semiconductor substrate, the second semiconductor substrate having an active surface comprising a first magnetic sensor, and the third semiconductor substrate having an active surface comprising a second magnetic sensor;

c) arranging the first semiconductor substrate at a location situated between the plurality of sensor substrates;

d) electrically connecting the first semiconductor substrate to each of the sensor substrates by means of at least one redistribution layer.

12. The method according to claim 11, wherein the active surface of the first semiconductor substrate provided in step a) comprises a plurality of first contact zones, and the active surface of the second substrate provided in step b) comprises a plurality of second contact zones, and the active surface of the third substrate provided in step b) comprises a plurality of third contact zones; and wherein at least some or all of the first, second and third contact zones have a shape encompassing an overall rectangular shape with a length≤45 μm and a width≤45 μm.

13. The method according to claim 11, wherein step c) comprises:

providing a base substrate;

placing the first, second and third semiconductor substrate with their active surfaces facing the base substrate; and over-molding the substrates with an epoxy molding compound, and curing; and/or wherein step d) comprises:

providing a passivation layer on top of the active surfaces, and patterning this passivation layer to open bondpads.

14. The method of claim 11, further comprising:

providing a second passivation layer;

opening the second passivation layer for forming electrical connections to a subset of bond-pads or connection zones of the first substrate;

providing a noble metal in said opening therefore forming said external terminals.

15. The method according to claim 11, further comprising a step of singulating the sensor devices by sawing or by laser cutting; and further comprising a step of testing or verifying the individual sensor devices at wafer level, before the step of singulation.

16. A current sensor system, comprising:

an electrical conductor configured for conducting a current to be measured;

a magnetic sensor device according to claim 1, arranged in the vicinity to the electrical conductor, and configured for measuring two magnetic field components of a magnetic field generated by said current when flowing through said electrical conductor, and for determining a difference of these magnetic field components, and for determining the current to be measured as a value proportional to said magnetic field difference.

17. A magnetoelastic torque sensor system, comprising:

a shaft comprising a first axial section that is magnetized in a first circumferential direction, and comprising a second axial section that is magnetized in a second circumferential direction, opposite the first circumferential direction;

a magnetic sensor device according to claim 1, arranged in the vicinity of the shaft, and configured for measuring two magnetic field components of a magnetic field generated by said shaft when a torque is exerted on the shaft, and for determining a difference of these magnetic field components, and for determining the torque to be measured as a function of said difference.

18. The magnetic sensor device according to claim 1, wherein the magnetic sensor device does not contain a lead frame.

* * * * *